United States Patent
Xie et al.

(10) Patent No.: US 9,825,070 B2
(45) Date of Patent: Nov. 21, 2017

(54) LCD DISPLAY WITH LIGHT SENSOR HAVING A LIGHT BLOCKING LAYER

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Zhenyu Xie, Beijing (CN); Shaoying Xu, Beijing (CN); Tiansheng Li, Beijing (CN); Changjiang Yan, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 202 days.

(21) Appl. No.: 14/356,004

(22) PCT Filed: Jun. 20, 2013

(86) PCT No.: PCT/CN2013/077514
§ 371 (c)(1),
(2) Date: May 2, 2014

(87) PCT Pub. No.: WO2014/153864
PCT Pub. Date: Oct. 2, 2014

(65) Prior Publication Data
US 2015/0179689 A1    Jun. 25, 2015

(30) Foreign Application Priority Data
Mar. 28, 2013    (CN) .......................... 2013 1 0105416

(51) Int. Cl.
*H01L 27/144*    (2006.01)
*G02F 1/133*    (2006.01)
(Continued)

(52) U.S. Cl.
CPC ...... *H01L 27/1443* (2013.01); *G02F 1/13318* (2013.01); *H01L 27/1446* (2013.01);
(Continued)

(58) Field of Classification Search
CPC ........... H01L 27/14743; H01L 27/1446; H01L 31/0203; H01L 31/02164; H01L 31/202;
(Continued)

(56) References Cited

U.S. PATENT DOCUMENTS

2005/0082968 A1    4/2005  Choi et al.
2008/0055297 A1*   3/2008  Park .................... G02F 1/13318
                                                345/205
(Continued)

FOREIGN PATENT DOCUMENTS

CN    1607561 A      4/2005
CN    101611499 A    12/2009
(Continued)

OTHER PUBLICATIONS

International Search Report dated Sep. 1, 2014; PCT/CN2013/077514.
(Continued)

*Primary Examiner* — Peter Bradford
(74) *Attorney, Agent, or Firm* — Ladas & Parry LLP

(57) ABSTRACT

An array substrate, a manufacturing method thereof, and a display device are provided. The array substrate includes a display area and a non-display area. The non-display area includes at least one light sensor each including a light blocking layer on a substrate and for blocking light emitted from a backlight source; an insulating layer on the light
(Continued)

blocking layer; a amorphous silicon layer on the insulating layer at a location corresponding to the light blocking layer and for sensing external light; an input electrode and an output electrode on the amorphous silicon layer and not contacting each other. The input electrode and the output electrode both contact the amorphous silicon layer, a part of the amorphous silicon layer between the input electrode and the output electrode forms a conductive channel. The output electrode is connected with a photoelectric detection circuit for inputting drain current generated by the conductive channel into the photoelectric detection circuit.

9 Claims, 3 Drawing Sheets

(51) Int. Cl.
    *H01L 31/0203*    (2014.01)
    *H01L 31/0216*    (2014.01)
    *H01L 31/20*    (2006.01)
    *H01L 29/786*    (2006.01)
    *G02F 1/1335*    (2006.01)
    *G02F 1/1333*    (2006.01)

(52) U.S. Cl.
    CPC .. *H01L 29/78633* (2013.01); *H01L 29/78678* (2013.01); *H01L 31/0203* (2013.01); *H01L 31/02164* (2013.01); *H01L 31/202* (2013.01); *G02F 1/133512* (2013.01); *G02F 2001/133388* (2013.01)

(58) Field of Classification Search
    CPC ........... G02F 1/13318; G02F 1/133512; G02F 2001/133388
    See application file for complete search history.

(56) References Cited

U.S. PATENT DOCUMENTS

| | | | |
|---|---|---|---|
| 2008/0230861 A1* | 9/2008 | Li | H01L 27/14623 257/435 |
| 2008/0258155 A1* | 10/2008 | Chiba | H01L 31/02164 257/80 |
| 2009/0243993 A1 | 10/2009 | Kuga | |
| 2010/0065851 A1* | 3/2010 | Makita | H01L 27/12 257/72 |
| 2010/0110096 A1 | 5/2010 | Satoh et al. | |
| 2011/0109609 A1* | 5/2011 | Jeong | G02F 1/13318 345/211 |
| 2011/0122352 A1* | 5/2011 | Tae | G02F 1/13318 349/138 |
| 2011/0221987 A1* | 9/2011 | Kim | G02F 1/133512 349/39 |
| 2011/0255046 A1* | 10/2011 | Kurokawa | G02F 1/13338 349/140 |
| 2011/0269253 A1* | 11/2011 | Choi | G02F 1/133512 438/29 |
| 2011/0297936 A1* | 12/2011 | Makita | H01L 27/1214 257/53 |
| 2012/0025189 A1* | 2/2012 | Jeon | H01L 27/14683 257/53 |

FOREIGN PATENT DOCUMENTS

| | | |
|---|---|---|
| CN | 101663758 A | 12/2011 |
| JP | 2008-158273 A | 7/2008 |
| TW | 201118492 | 6/2011 |

OTHER PUBLICATIONS

Second Chinese Office Action Appln. No. 201310105416.5; dated Apr. 20, 2015.
First Chinese Office Action dated Jan. 6, 2015; Appln. No. 201310105416.5.
Chinese Patent Certificate Appln. No. 1813353; dated Oct. 14, 2015.
International Preliminary Report on Patentability Appln. No. PCT/CN2013/077514; dated Sep. 29, 2015.
International Preliminary Report on Patentability Appln. No. PCT/CN2012/077514; dated Sep. 29, 2015.

\* cited by examiner

LCD DISPLAY WITH LIGHT SENSOR HAVING A LIGHT BLOCKING LAYER

TECHNICAL FIELD

Embodiments of the present invention relate to an array substrate, a manufacturing method thereof, and a display device.

BACKGROUND

Since liquid crystal displays (LCD) feature low radiation, small volume, small weight and low power consumption, they gradually replaced traditional cathode ray tube (CRT) displays and are widely applied in desktop computers, notebook computers, personal digital assistants (PDA), cellphones and TVs.

A prior art liquid crystal display mainly includes a liquid crystal module and a backlight module. Since the liquid crystal does not emit light itself, it needs the backlight module inside the liquid crystal display for providing a backlight source for it. The backlight module directs light emitted from the backlight source uniformly into the liquid crystal panel via an optical structure film to display images. As a display device, display brightness is a main performance parameter for the liquid crystal display.

While a liquid crystal display is in use, light intensity of the external environment in which it locates would vary. In order to satisfy display brightness requirements in different situations, it is necessary to adjust backlight brightness of the liquid crystal display in time depending on the intensity of external environment light, for the purpose of adjusting display brightness of the liquid crystal display. For example, in case of weak external environmental light, it is necessary to adjust the backlight brightness to low state, and in turn to reduce its display brightness to achieve the purpose of reduced electric energy loss. However, the display brightness of operation state of the prior art liquid crystal display is fixedly set, and the display brightness of the liquid crystal display is kept in a highly bright state regardless of the light intensity of external environment. It is impossible to automatically adjust its display brightness according to light intensity of external environment, while such high brightness display of the liquid crystal display could cause waste of electric energy.

In summary, with prior art liquid crystal displays, it is impossible to automatically adjust display brightness according to light intensity of external environment when light intensity in external environment in which they locate varies, hence resulting in waste of electric energy.

SUMMARY

Embodiments of the present invention provide an array substrate, a manufacturing method thereof and a display device for addressing the problem of prior art, that is, a liquid crystal display cannot automatically adjust its display brightness according to light intensity in external environment.

An embodiment of the present invention provides an array substrate comprising a display area and a non-display area, wherein the non-display area comprises at least one light sensor, and each light sensor comprises:

a light blocking layer on a substrate for blocking light emitted from a backlight source;

an insulating layer on the light blocking layer;

an amorphous silicon layer on the insulating layer at a location corresponding to the light blocking layer and for sensing external light;

an input electrode and an output electrode on the amorphous silicon layer and not contacting each other, wherein the input electrode and the output electrode both contact the amorphous silicon layer, a part of the amorphous silicon layer between the input electrode and the output electrode forms a conductive channel; the output electrode is connected with a photoelectric detection circuit for inputting drain current generated by the conductive channel into the photoelectric detection circuit.

In one example, an area covered by the light blocking layer is greater than an area covered by the amorphous silicon layer.

In one example, the input electrode is applied with a voltage greater than a turning on voltage of the light sensor.

In one example, the light blocking layer is applied with a voltage smaller than a pinch-off voltage of the light sensor.

In one example, the display area comprises a thin film transistor (TFT) for driving each pixel;

the light blocking layer and a gate electrode of the TFT contained in the display area are in a same layer and of a same material;

the insulating layer and a gate insulating layer of the TFT are a same structure layer;

the amorphous silicon layer and an active layer of the TFT are in a same layer and of a same material;

the input electrode and a source electrode of the TFT are in a same layer and of a same material;

the output electrode and a drain electrode of the TFT are in a same layer and of a same material.

In one example, the light sensor further comprises a protection layer on the input electrode and the output electrode.

In one example, the protection layer and a passivation layer in the display area are a same structure layer.

Another embodiment of the invention provides a display device comprising the array substrate as mentioned above.

In one example, a window that allows external light to pass is disposed in the display device at a location corresponding to the light sensor, and the amorphous silicon layer in the light sensor is configured to sense external light through the window.

In one example, the display device comprises a voltage source for supplying a voltage for the input electrode and the light blocking layer, the voltage source being configured to apply a voltage greater than a turning on voltage of the light sensor on the input electrode, and apply a voltage smaller than a pinch-off voltage of the light sensor on the light blocking layer.

Still another embodiment provides a manufacturing method of an array substrate, comprising:

by one patterning process, forming a gate electrode in a display area on a substrate, and forming a light blocking layer for blocking light emitted by a backlight source in a non-display area of the substrate;

by one patterning process, forming an insulating layer on the substrate with the gate electrode and the light blocking layer formed thereon, and forming an active layer in the display area at a location corresponding to the gate electrode on the substrate with the insulating layer formed thereon, and forming an amorphous silicon layer in the non-display area at a location corresponding to the light blocking layer on the substrate with the insulating layer formed thereon;

by one patterning process, forming a source electrode and a drain electrode not contacting each other on the active layer in the display area of the substrate with the active layer formed thereon, and forming an input electrode and an output electrode not contacting each other on the amorphous silicon layer in the non-display area on the substrate with the amorphous silicon layer formed thereon, wherein the source electrode and the drain electrode both contact the active layer; the input electrode and the output electrode both contact the amorphous silicon layer, a part of the amorphous silicon layer between the input electrode and the output electrode forms a conductive channel; the output electrode is connected with a photoelectric detection circuit for transferring drain current generated by the conductive channel to the photoelectric detection circuit.

In one example, the light blocking layer and the gate electrode are in a same layer and of a same material;

the amorphous silicon layer and the active layer are in a same layer and of a same material;

the input electrode and the source electrode are in a same layer and of a same material;

the output electrode and the drain electrode are in a same layer and of a same material.

In one example, the method further comprises:

by one patterning process, forming a protection layer on the substrate with the source electrode and the drain electrode, as well as the input electrode and the output electrode formed thereon, and forming vias in the protection layer at locations corresponding to the drain electrode, the light blocking layer, the input electrode and the output electrode.

In one example, the method further comprises:

forming a pixel electrode in the display area on the substrate with the protection layer formed thereon with one patterning process.

The non-display area of the array substrate according to an embodiment of the present invention includes at least one light sensor. The light sensor includes a light blocking layer, an insulating layer, an amorphous silicon layer for sensing external light, an input electrode and an output electrode. The amorphous silicon in the amorphous silicon layer generates photo-induced carriers while being irradiated. The stronger the external light is, the more photo-induced carriers are generated. The output electrode of the light sensor is connected with the photoelectric detection circuit such that it is possible to detect external light intensity in real time through the light sensor and the photoelectric detection circuit and adjust the brightness of backlight source according to external light intensity.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

A non-display area of the array substrate according to an embodiment of the present invention includes at least one light sensor. The amorphous silicon in the amorphous silicon layer of the light sensor generates photo-induced carriers while being irradiated. The stronger the external light is, the more photo-induced carriers are generated. The output electrode of the light sensor is connected with the photoelectric detection circuit such that it is possible to detect external light intensity in real time through the light sensor and the photoelectric detection circuit and adjust the brightness of backlight source according to external light intensity.

Embodiments of the present invention will be described in detail below with reference to the accompanying drawings.

Figure 1:
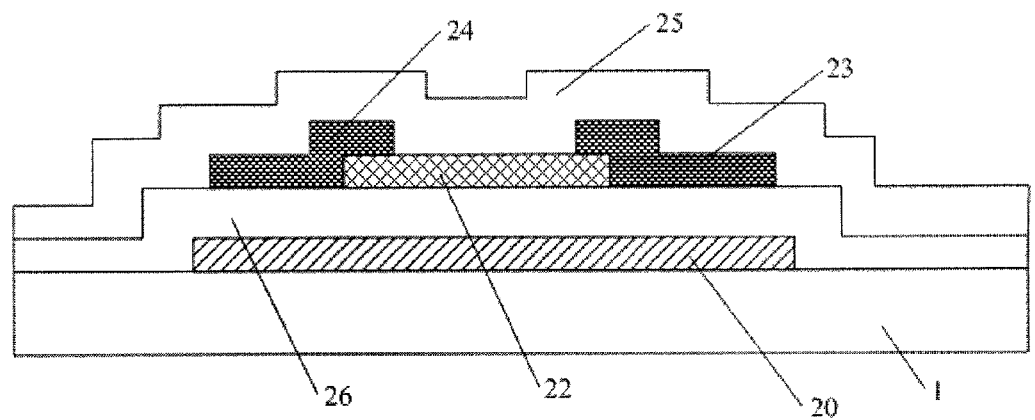
FIG. 1 is a schematic diagram of sectional structure of a light sensor in an array substrate according to an embodiment of the present invention.

The array substrate according to embodiments of the present invention includes a display area and a non-display area, wherein the display area includes a plurality of gate lines, a plurality of data lines and pixel units defined by the gate lines and the data lines crossing each other. Each pixel unit is connected with a gate line and a data line respectively through a TFT (Thin Film Transistor). The non-display area is located at outside of the display area and includes at least one light sensor. As illustrated in FIG. 1, each light sensor includes:

a light blocking layer 20 on a substrate 1 for blocking light emitted from the backlight source;

an insulating layer 26 on the light blocking layer 20;

an amorphous silicon layer 22 on the insulating layer 26 at a location corresponding to the light blocking layer 21 and configured to sense extraneous light;

an input electrode 23 and an output electrode 24 located on the amorphous silicon layer 22 and not contacting each other, wherein the input electrode 23 and the output electrode 24 contact the amorphous silicon layer 22 respectively and the amorphous silicon layer 22, the input electrode 23 and the output electrode 24 form a conductive channel similar to that of a TFT.

Figure 2:
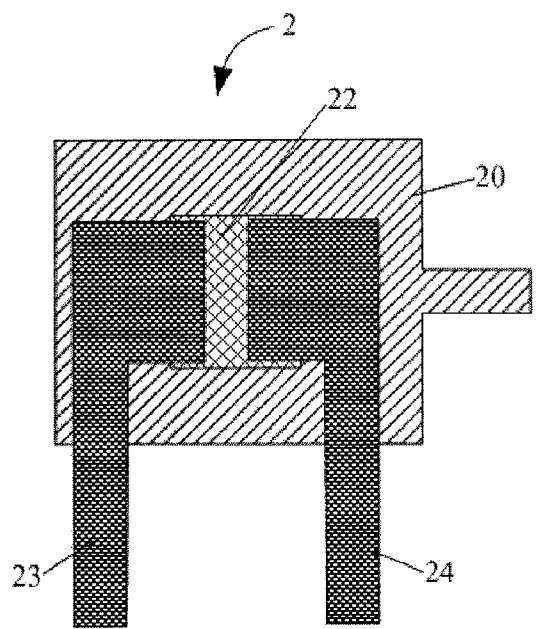
FIG. 2 is a top view of the structure of a light sensor in an array substrate according to an embodiment of the present invention.

In order to prevent light from the backlight source from influencing the light sensor sensing external light, for example, as illustrated in FIG. 2, the light blocking layer 20 of the light sensor 2 according to an embodiment of the present invention covers an area greater than that covered by the amorphous silicon layer 22, that is, the area covered by the light blocking layer 20 can completely cover the area covered by the amorphous silicon layer 22.

In order to prevent the light sensor from adversely influencing the display area of the array substrate, the light sensor according to the embodiment of the present invention is disposed in the non-display area of the array substrate.

In an operation state, the light sensor 2 according to an embodiment of the present invention has a voltage applied on its input electrode 23 not smaller than the turning on voltage of the light sensor 2. For example, the voltage applied on the input electrode 23 is greater than the turning on voltage of the light sensor 2 such that when the amorphous silicon layer 22 of the light sensor 2 is irradiated by external light, the conductive channel formed by the amorphous silicon layer 22, the input electrode 23 and the output electrode 24 generates leakage current that is output by the output electrode 24, wherein the voltage on the input electrode 23 (typically 10V~20V) may be provided by an external voltage source or an internal circuit.

The output electrode 24 of the light sensor 2 in the embodiment of the present invention is connected with a photoelectric detection circuit for adjusting brightness of the backlight source according to the magnitude of leakage current flowing from the output electrode 24, hence saving energy.

In order to bring the conductive channel of the light sensor into off state for initial state, for example, the voltage applied on the light blocking layer (typically 0~−30V) is not greater than the pinch-off voltage of the light sensor. For example, the voltage applied on the light blocking layer is smaller than the pinch-off voltage of the light sensor, wherein the voltage on the light blocking layer (typically 0~−30V) may be supplied by an external voltage source or by an internal circuit.

Further, in order to adjust the sensitivity of the light sensor, in operation, a regulation voltage is applied on the light blocking layer and in case that the output electrode outputs a too low current, the output current is increased to enhance the detection sensitivity.

Specifically, since the embodiments of the present invention detect intensity of external light mainly by detecting the magnitude of leakage current generated by the light sensor under external irradiation, if the voltage on the light blocking layer is too low (for example, −30V), the generated leakage current would be very small, hence influencing detection result. Therefore, when the voltage on light blocking layer is below a set threshold, it is possible to apply a regulation voltage on the light blocking layer, wherein the value of regulation voltage is around the value of threshold voltage Vth of the light sensor, such as −3V~−5V, which can effectively increase leakage current and improve detection sensitivity.

In order to reduce manufacturing costs, for example, the light blocking layer of the light sensor and the gate electrode of TFT in display area of the array substrate in embodiments of the present invention are located in the same layer and of the same material.

In one example, materials for the light blocking layer and the gate electrode are metal materials, specifically a monolayer film of AlNd (aluminum neodymium), Al (aluminum), Cu (copper), Mo (molybdenum), MoW (molybdenum tungsten), or Cr (chromium) or composite film of any combination of at least two materials of AlNd, Al, Cu, Mo, MoW or Cr.

As an example, the thickness of the light blocking layer and the gate electrode is 3000 angstroms.

In order to reduce manufacturing costs, for example, the insulating layer of light sensor and the gate insulating layer of TFT in the display area in embodiments of the present invention are the same structure layer.

In one example, materials for the insulating layer and the gate insulating layer are insulating materials, specifically a monolayer film of SiNx (silicon nitride), SiOx (silicon oxide) or SiOxNy (silicon oxynitride), or a composite film of combination of at least two materials of SiNx, SiOx and SiOxNy.

As an example, the thickness of insulating layer is 4000 angstroms.

In order to reduce manufacturing costs, for example, the amorphous silicon layer of the light sensor and the active layer of TFT in display area in embodiments of the present invention are located in the same layer and of the same material.

In one example, the amorphous silicon layer and the active layer are of amorphous silicon material.

As an example, the amorphous silicon layer and the active layer both have a thickness of 2300 angstroms.

In order to reduce manufacturing costs, for example, the input electrode of the light sensor and the source electrode of TFT in display area in embodiments of the present invention are located in the same layer and of the same material.

In one example, the materials for the input electrode and source electrode are a monolayer film of Mo, MoW or Cr, or a composite film of any combination of at least two materials of Mo, MoW and Cr.

As an example, the input electrode and the source electrode both have a thickness of 2000 angstroms~4000 angstroms.

In order to reduce manufacturing costs, for example, the output electrode of the light sensor and the drain electrode of TFT in display area in embodiments of the present invention are located in the same layer and of the same material.

In one example, the materials for the output electrode and the drain electrode are a monolayer film of Mo, MoW or Cr, or a composite film of any combination of at least two materials of Mo, MoW and Cr.

As an example, the output electrode and the drain electrode both have a thickness of 2000 angstroms~4000 angstroms.

In one example, the drain electrode and the source electrode of TFT in the display area are of the same material, the input electrode and the output electrode of the light sensor are of the same material.

In one example, the light sensor according to an embodiment of the present invention further includes:

a protection layer 25 on the input electrode 23 and the output electrode 24 and for protecting the above-mentioned structure of the light sensor from external erosion.

In order to reduce manufacturing costs, for example, the protection layer of light sensor and the passivation layer of TFT in the display area in embodiments of the present invention are the same structure layer.

In one example, the materials for the protection layer and the passivation layer are both insulating materials, specifically a monolayer film of SiNx, SiOx or SiOxNy, or a composite film of any combination of at least two materials of SiNx, SiOx and SiOxNy.

As an example, the protection layer has a thickness of 2500 angstroms.

Figure 3A:
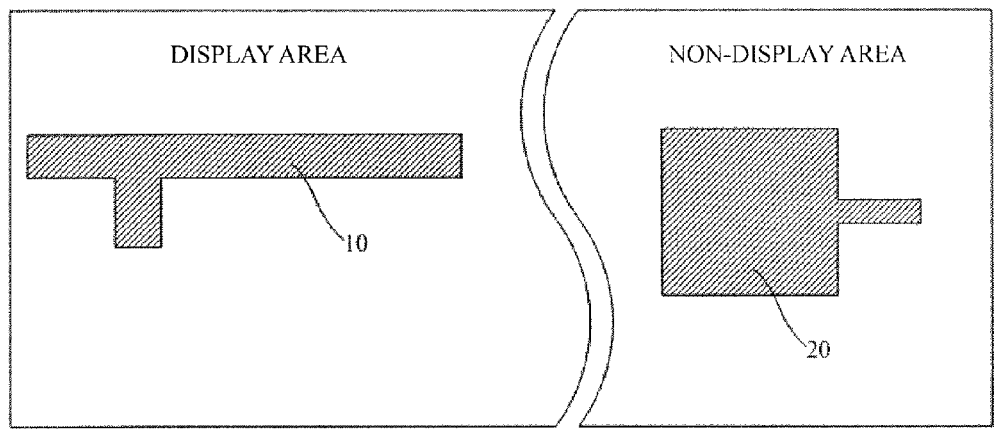
FIGS. 3A-3E are top view of structures of a display area and a non-display area in the manufacturing process of an array substrate according to embodiments of the present invention.

The manufacturing method of the array substrate according to an embodiment of the present invention includes the following steps:

Step 301, forming a gate electrode 10 in a display area on a substrate and forming a light blocking layer 20 in a non-display area on the substrate by one patterning process, as illustrated in FIG. 3A;

The gate electrode 10 and the light blocking layer 20 are in the same layer and of the same material;

In one example, a material for the light blocking layer may be a monolayer film of AlNd (aluminum neodymium), Al (aluminum), Cu (copper), Mo (molybdenum), MoW (molybdenum tungsten), or Cr (chromium) or composite film of any combination of at least two materials of AlNd, Al, Cu, Mo, MoW or Cr.

Figure 3B:
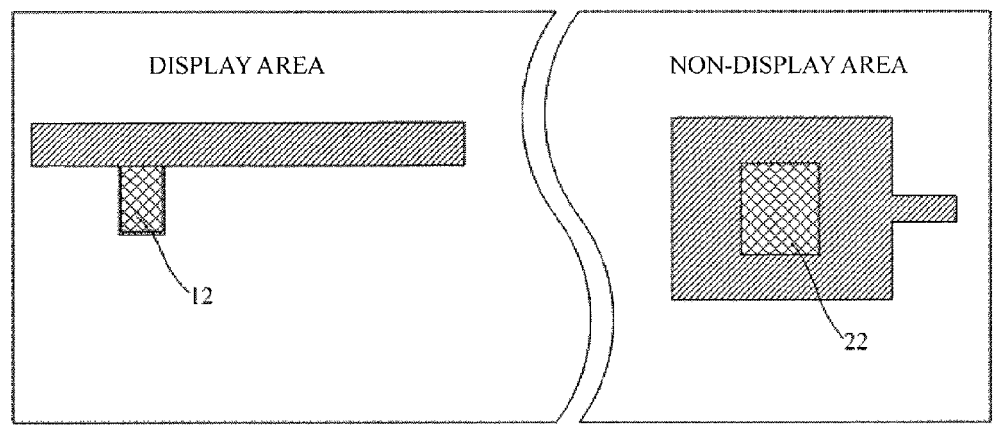

Step 302, forming an insulating layer on the substrate with the gate electrode and the light blocking layer formed thereon and forming an active layer 12 in the display area at a locations corresponding to the gate electrode on the substrate with the insulating layer formed thereon, and forming an amorphous silicon layer 22 in the non-display area at a location corresponding to the light blocking layer on the substrate with the insulating layer formed, as illustrated in FIG. 3B;

The insulating layer may be a monolayer film of SiNx, SiOx or SiOxNy, or a composite film of any combination of at least two materials of SiNx, SiOx and SiOxNy.

The amorphous silicon layer 22 and the active layer 12 are in the same layer and of the same material.

Specifically, the amorphous silicon layer and the active layer are of amorphous silicon material.

Figure 3C:
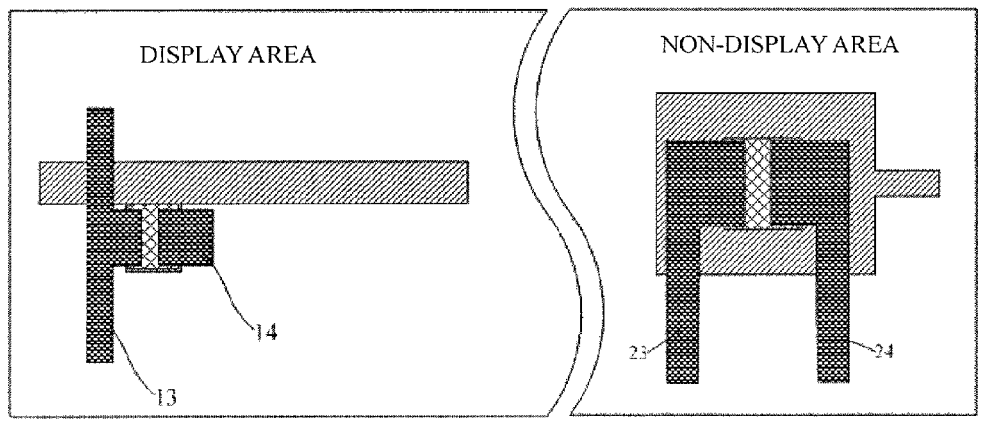

Step 303, by one patterning process, forming a source electrode 13 and a drain electrode 14 not contacting each other on the active layer in the display area on the substrate with the active layer formed thereon so as to form a TFT channel, and forming an input electrode and an output electrode not contacting each other on the amorphous silicon layer in the non-display area on the substrate with the amorphous silicon layer formed thereon so as to form a conductive channel similar to that of the TFT, as illustrated in FIG. 3C;

The input electrode and the source electrode are in the same layer and of the same material; and the output electrode and the drain electrode are in the same layer and of the same material.

Specifically, the material for the input electrode is a monolayer film of Mo, MoW or Cr, or a composite film of any combination of at least two materials of Mo, MoW and Cr.

The material for the output electrode is a monolayer film of Mo, MoW or Cr, or a composite film of any combination of at least two materials of Mo, MoW and Cr.

In one example, the drain electrode and the source electrode of the TFT in the display area are of the same material, the input electrode and the output electrode of the light sensor are of the same material.

Figure 3D:
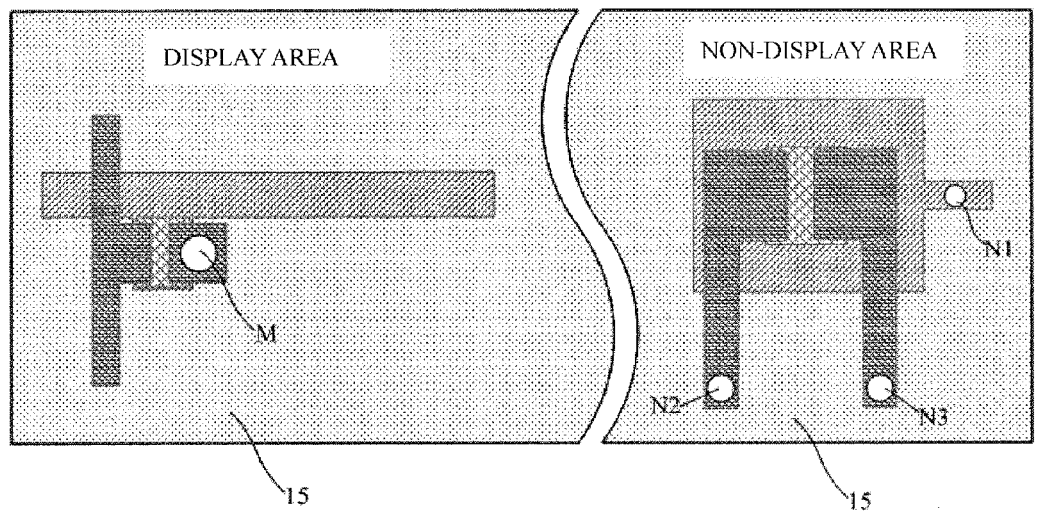

In addition, the manufacturing method of the array substrate according to an embodiment of the present invention further includes the following steps:

Step 304, by one patterning process, forming a protection layer 15 on the substrate with the source electrode, the drain electrode, the input electrode and the output electrode formed thereon as illustrated in FIG. 3D, wherein a via M is formed in the protection layer 15 at a location corresponding to the drain electrode, a via N1 is formed in the protection layer 15 at a location corresponding to the light blocking layer through which a voltage signal is applied to the light blocking layer; a via N2 is formed in the protection layer 15 at a location corresponding to the input electrode through which a voltage signal is applied to the input electrode; a via N3 is formed in the protection layer 15 at a location corresponding to the output electrode through which the output electrode of the light sensor are connected with the photoelectric detection circuit to input photo-induced carriers generated in the conductive channel into the photoelectric detection circuit for processing.

The material for the protection layer is an insulating material, specifically a monolayer film of SiNx, SiOx or SiOxNy, or a composite film of any combination of at least two materials of SiNx, SiOx and SiOxNy.

Figure 3E:
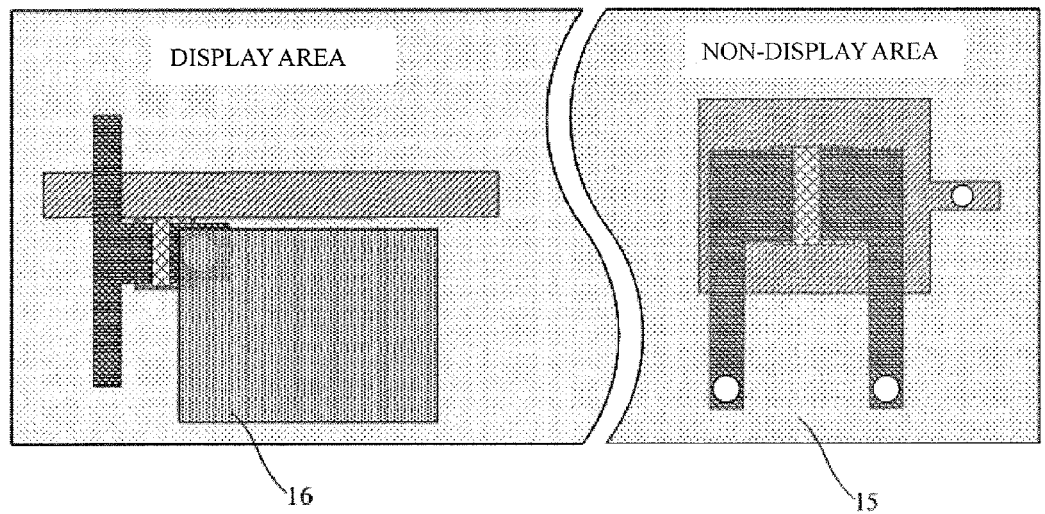

In addition, the manufacturing method of the array substrate according to an embodiment of the present invention further includes the following steps:

Step 305, with one patterning process, forming a pixel electrode 16 in the display area on the substrate with the protection layer formed thereon, as illustrated in FIG. 3E, wherein the pixel electrode is connected with the drain electrode through the via M;

A material for the pixel electrode may be ITO (Indium-Tin-Oxide) or IZO (Indium Zinc Oxide), or a composite film of combination of ITO and IZO.

It is to be noted that since the array substrate includes at least one light sensor, while manufacturing the color filter substrate, the black photoresist on the color filter substrate at the location corresponding to the light sensor must be removed. One the one hand, the light sensor according to embodiments of the present invention includes a light blocking layer that can prevent light of backlight source from influencing the light sensor. On the other hand, since the light sensor according to embodiments of the present invention is located at the non-display area of the array substrate (namely edges of the pixel area), they will not adversely influence the display area.

The specific removal approach is as follows. The color filter is comprised of a RGB matrix. A typical manufacturing method is first coating one of the color organic materials and then forming the matrix pattern of this color by exposure and development. While carrying out the process, a part of the organic material of this color corresponding to the light sensor is removed by exposure and development. In the same way, while forming the other two colors, a part corresponding to the light sensor is also removed. Thus, the area not covered by RGB organic materials are formed, external light can also pass the area and irradiate the light sensor, and light is sensed by the amorphous silicon layer of the light sensor. An embodiment of the present invention further provides a display device including the above-mentioned array substrate.

Specifically, a window that allows external light to pass (for example a via hole) is disposed in the display device at a location corresponding to the light sensor to enable the amorphous silicon layer of the light sensor to sense external light.

For example, the display device includes a voltage source for supplying the input electrode and the light blocking layer with a voltage, which is configured to supply a voltage greater than the turning on voltage of the light sensor to the input electrode and supply a voltage smaller than the pinch-off voltage of the light sensor to the light blocking layer.

While preferred embodiments of the present invention have been described, one skilled in the art can make additional changes and modifications to these embodiments upon learning the basic innovative concepts. Therefore, the appended claims are intended to be interpreted as including preferred embodiments and all changes and modifications that fall into the scope of the present invention.

The non-display area of the array substrate according to embodiments of the present invention includes at least one light sensor including a light blocking layer, an insulating layer, an amorphous silicon layer for sensing external light, an input electrode and an output electrode. The amorphous silicon in the amorphous silicon layer generates photo-induced carriers while being irradiated. The stronger the external light is, the more photo-induced carriers are generated. The output electrode of the light sensor is connected with the photoelectric detection circuit such that it is possible to detect in real time the intensity of external light and adjust brightness of backlight source according to the intensity of external light.

What are described above is related to the illustrative embodiments of the disclosure only and not limitative to the scope of the disclosure; the scopes of the disclosure are defined by the accompanying claims.

The invention claimed is:

1. An array substrate comprising a display area and a non-display area, wherein the non-display area comprises at least one light sensor, and each light sensor comprises:
   a light blocking layer on a substrate for blocking light emitted from a backlight source;
   an insulating layer on the light blocking layer;
   an amorphous silicon layer on the insulating layer at a location corresponding to the light blocking layer and for sensing external light;
   an input electrode and an output electrode on the amorphous silicon layer and not contacting each other, wherein the input electrode and the output electrode both contact the amorphous silicon layer, a part of the amorphous silicon layer between the input electrode and the output electrode forms a conductive channel;
   the output electrode is connected with a photoelectric detection circuit for inputting drain current generated by the conductive channel into the photoelectric detection circuit,
   wherein the light blocking layer and a gate electrode of the TFT contained in the display area are in a same layer and of a same material,
   wherein the array substrate further comprises a voltage source configured to supply a voltage greater than a turning on voltage of the light sensor to the input electrode; and
   wherein the array substrate further comprises a voltage source configured to supply a voltage smaller than a pinch-off voltage of the light sensor and close to the same as a threshold voltage of the light sensor to the light blocking layer.

2. The array substrate of claim 1, wherein an area covered by the light blocking layer is greater than an area covered by the amorphous silicon layer.

3. The array substrate of claim 2, wherein the display area comprises a thin film transistor (TFT) for driving each pixel;
   the insulating layer and a gate insulating layer of the TFT are a same structure layer;
   the amorphous silicon layer and an active layer of the TFT are in a same layer and of a same material;
   the input electrode and a source electrode of the TFT are in a same layer and of a same material;
   the output electrode and a drain electrode of the TFT are in a same layer and of a same material.

4. The array substrate of claim 2, wherein the light sensor further comprises a protection layer on the input electrode and the output electrode.

5. The array substrate of claim 1, wherein the display area comprises a thin film transistor (TFT) for driving each pixel;
   the insulating layer and a gate insulating layer of the TFT are a same structure layer;
   the amorphous silicon layer and an active layer of the TFT are in a same layer and of a same material;
   the input electrode and a source electrode of the TFT are in a same layer and of a same material;
   the output electrode and a drain electrode of the TFT are in a same layer and of a same material.

6. The array substrate of claim 1, wherein the light sensor further comprises a protection layer on the input electrode and the output electrode.

7. The array substrate of claim 6, wherein the protection layer and a passivation layer in the display area are a same structure layer.

8. A display device comprising the array substrate of claim 1.

9. The display device of claim 8, wherein a window that allows external light to pass is disposed in the display device at a location corresponding to the light sensor, and the amorphous silicon layer in the light sensor is configured to sense external light through the window.

* * * * *